United States Patent
Hsu et al.

(10) Patent No.: US 9,563,731 B2
(45) Date of Patent: Feb. 7, 2017

(54) CELL BOUNDARIES FOR SELF ALIGNED MULTIPLE PATTERNING ABUTMENTS

(71) Applicant: Taiwan Semiconductor Manufacturing Co., Ltd., Hsin-Chu (TW)

(72) Inventors: Chin-Hsiung Hsu, Guanyin Township (TW); Li-Chun Tien, Tainan (TW); Pin-Dai Sue, Tainan (TW); Ching Hsiang Chang, New Taipei (TW); Wen-Hao Chen, Hsin-Chu (TW); Cheng-I Huang, Hsinchu (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 0 days.

(21) Appl. No.: 14/210,490

(22) Filed: Mar. 14, 2014

(65) Prior Publication Data

US 2014/0282289 A1    Sep. 18, 2014

Related U.S. Application Data

(60) Provisional application No. 61/790,182, filed on Mar. 15, 2013.

(51) Int. Cl.
G06F 17/50 (2006.01)
G03F 7/20 (2006.01)
G03F 1/70 (2012.01)

(52) U.S. Cl.
CPC ........... *G06F 17/5068* (2013.01); *G03F 1/70* (2013.01); *G03F 7/70433* (2013.01); *G03F 7/70466* (2013.01)

(58) Field of Classification Search
USPC .......................................... 716/51
See application file for complete search history.

(56) References Cited

U.S. PATENT DOCUMENTS

| | | | |
|---|---|---|---|
| 2002/0000618 A1* | 1/2002 | Saito et al. | 257/368 |
| 2006/0186478 A1* | 8/2006 | Hughes et al. | 257/368 |
| 2009/0031271 A1* | 1/2009 | White et al. | 716/10 |
| 2011/0111330 A1* | 5/2011 | Schultz et al. | 430/5 |
| 2012/0137261 A1* | 5/2012 | Ban et al. | 716/52 |
| 2012/0167021 A1* | 6/2012 | Chen et al. | 716/55 |
| 2013/0036397 A1* | 2/2013 | Lee et al. | 716/122 |
| 2014/0007029 A1* | 1/2014 | Boone et al. | 716/110 |

* cited by examiner

*Primary Examiner* — Bryce Aisaka
(74) *Attorney, Agent, or Firm* — Duane Morris LLP

(57) ABSTRACT

A system and method of determining a cell layout are disclosed. The method includes receiving a circuit design corresponding to a predetermined circuit design, the circuit design having a first set of cells and abutting adjacent cells in the first set of cells, the abutted cells having a first boundary pattern therebetween. The first boundary pattern is exchanged with a second boundary pattern based on a number or positions of signal wires in the first boundary pattern. A cell layout for use in a patterning process can then be determined, the cell layout including the second boundary pattern.

19 Claims, 12 Drawing Sheets

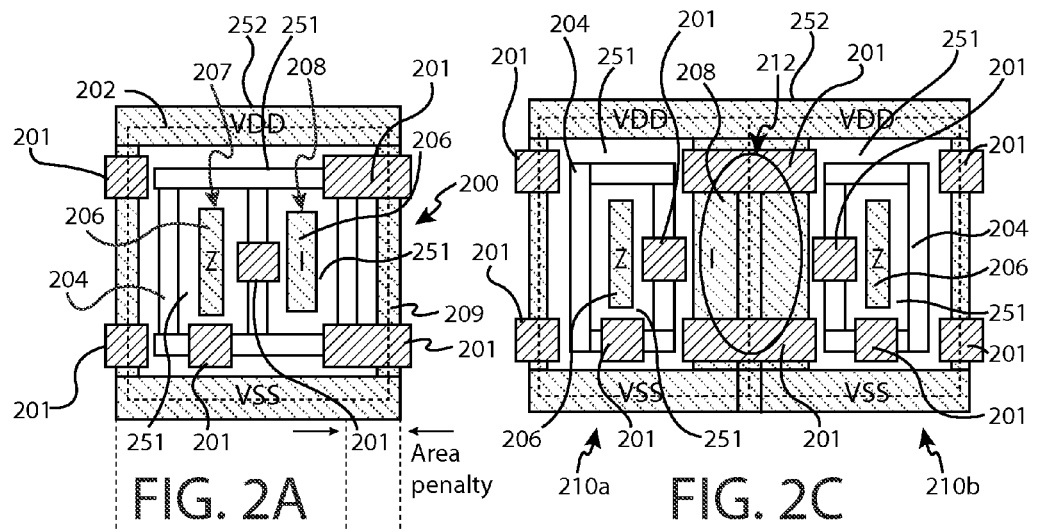
FIG. 2A
FIG. 2C
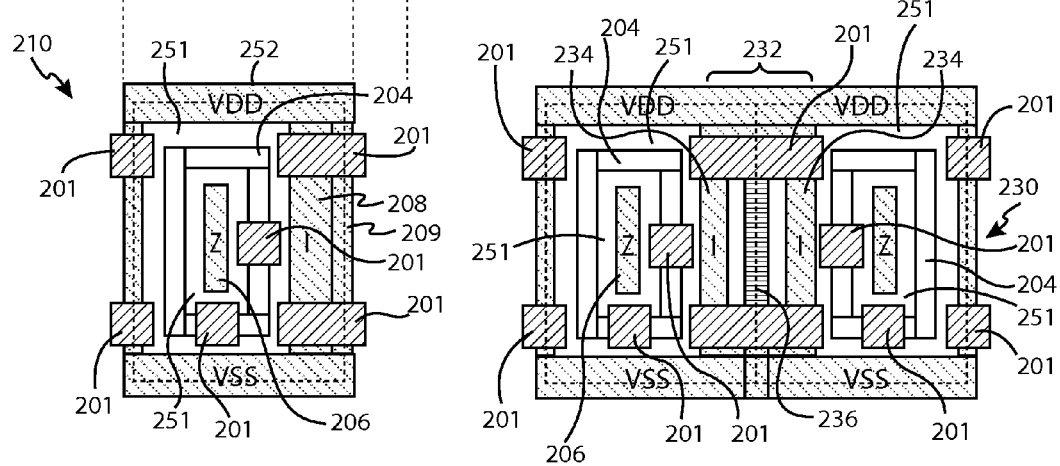
FIG. 2B
FIG. 2D

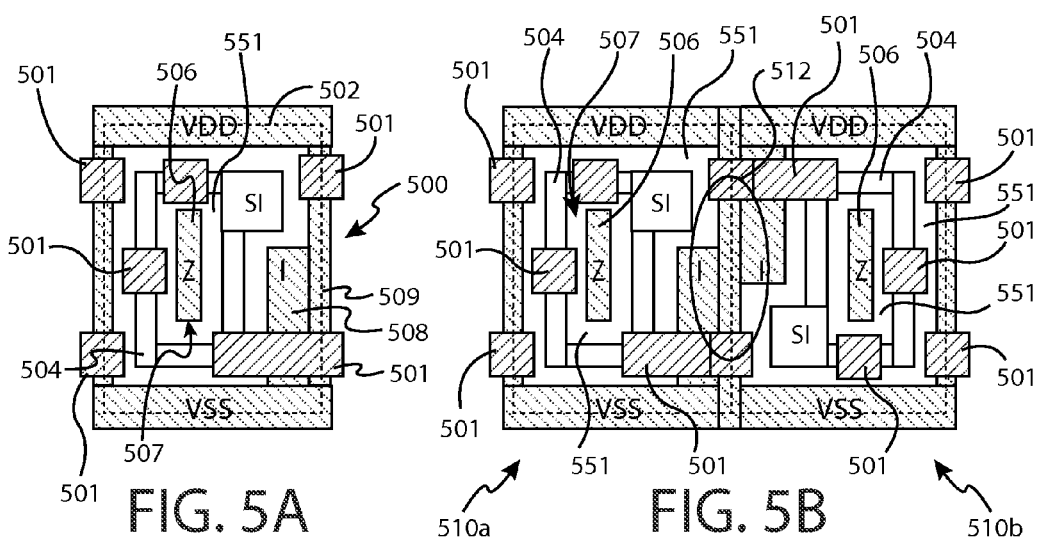
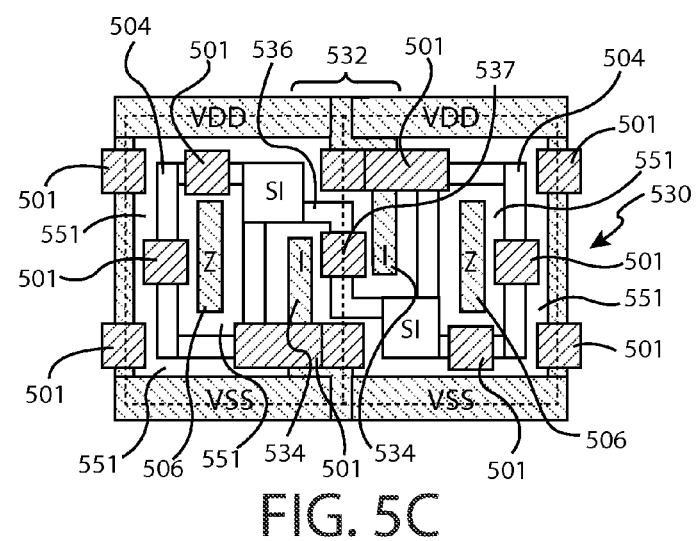

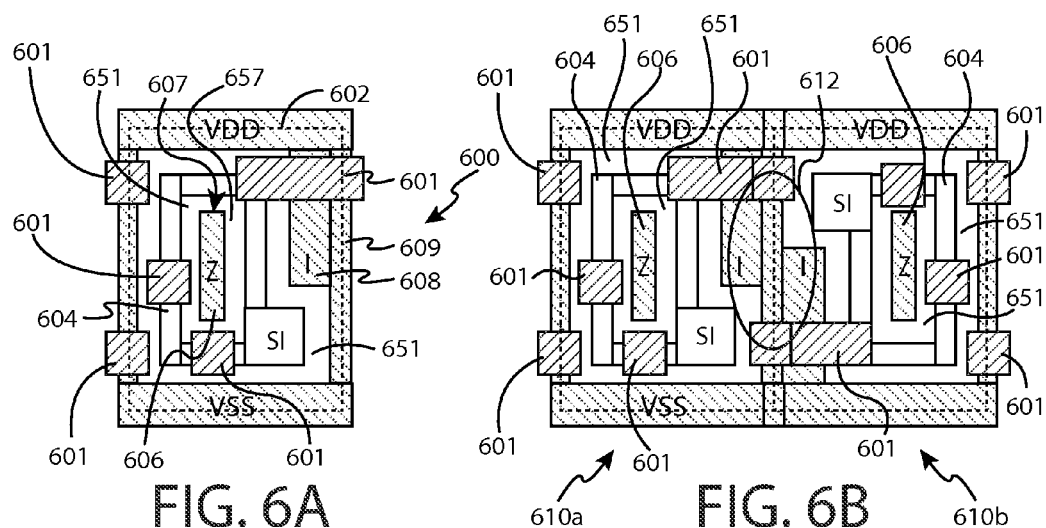
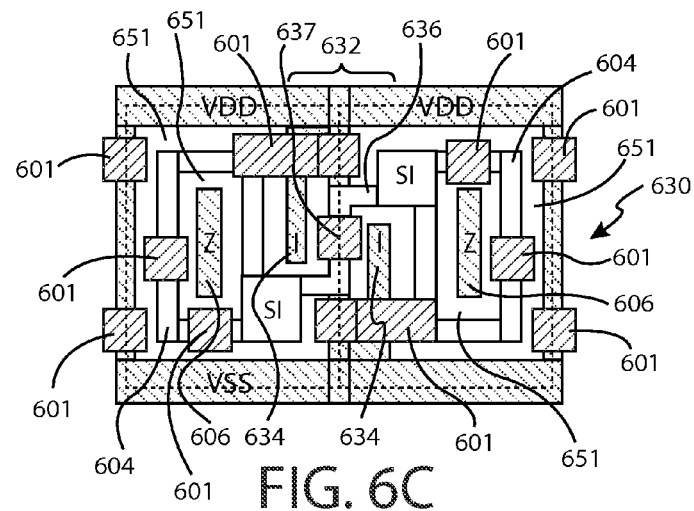
FIG. 6A
FIG. 6B
FIG. 6C

CELL BOUNDARIES FOR SELF ALIGNED MULTIPLE PATTERNING ABUTMENTS

BACKGROUND

This application claims the benefit of U.S. Provisional Patent Application No. 61/790,182, filed Mar. 15, 2013, which is expressly incorporated by reference herein in its entirety.

Integrated circuits (ICs) are created by patterning a substrate and materials deposited on the substrate or semiconductor wafer. The patterned features generally comprise devices and interconnections. Processes for creating an IC generally commence by a designer hierarchically defining functional components of a circuit using hardware description language. From this high-level functional description, a physical circuit implementation dataset is created describing cell-to-cell connectivity. Using this dataset, a layout file is created through a placing and routing process assigning logic cells to physical locations in the device layout and routing their respective interconnections. Component devices and interconnections of the IC are then constructed or processed layer by layer.

With a continuing desire to provide greater functionality in smaller packages and the evolution of system-on-chip and mixed-signal designs, IC feature geometries are being driven to smaller and smaller dimensions. One class of technologies used to enhance feature density is referred to as multiple patterning and/or double patterning There are several types of double patterning in use, including: litho-etch -litho-etch (LELE); litho-freeze-litho-etch (LFLE); self-aligned double patterning (SADP), also known as spacer-assisted double patterning, or sidewall image transfer (SIT). Such techniques can be used to enhance feature density; however, there are limitations to these techniques.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features can be arbitrarily increased or reduced for clarity of discussion.

FIGS. 2A and 2B are illustrations of two SADP cell boundaries.

FIG. 2C is an illustration of a merged cell embodiment.

FIG. 2D is an illustration of a merged cell embodiment having a cell boundary exchanged according to some embodiments of the present disclosure.

FIGS. 5A-5C are illustrations of a further cell boundary exchange according to other embodiments of the present disclosure.

FIGS. 6A-6C are illustrations of an additional cell boundary exchange according to other embodiments of the present disclosure.

DETAILED DESCRIPTION

Figure 1A:
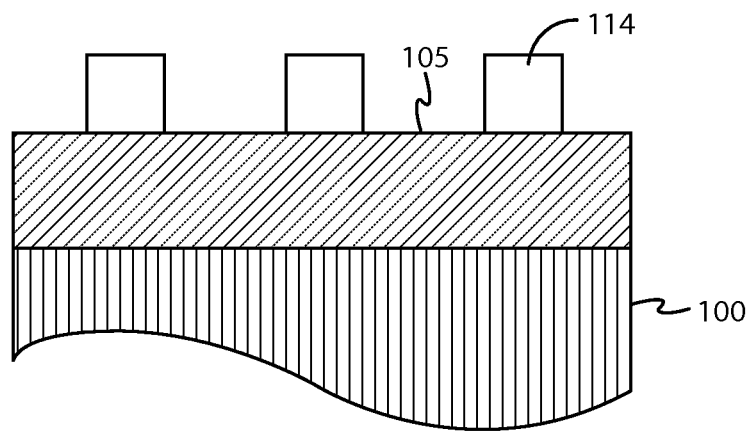
FIGS. 1A-1H are graphical depictions of a self-aligned double patterning (SADP) method.

The exemplary methods and systems in various embodiments described herein overcome at least some disadvantages of other patterning techniques used for the design of integrated circuits (ICs). For example, some embodiments described herein substantially reduce a self-aligned double patterning (SADP) layout area by merging signal lines with, for example, boundary dummy lines of adjacent cells in the layout to avoid area penalties due to a respective SADP property. Boundary dummy lines include boundary lines that are not connected to any devices in the IC. In case the merging of the lines result in SADP cell abutment problems, some embodiments described herein facilitate addressing the abutment problems by conducting post-processing that satisfies SADP properties and keeps cell functionalities. By using this approach, area penalties can be circumvented and degradation on the resulting IC can be prevented.

It is understood that the following disclosure provides many different embodiments or examples for implementing different features of various embodiments. Specific examples of components and arrangements are described below to simplify the present disclosure. These are, of course, merely examples and are not intended to be limiting. The present disclosure may repeat reference numerals and/or letters in the various examples. This repetition is for the purpose of simplicity and clarity and does not in itself dictate a relationship between the various embodiments and/or configurations discussed.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed disclosure, and the others are deduced by analogy. Moreover, space orientation terms such as "under", "on", "up", "down", etc., are used to describe a relationship between a device or a characteristic and another device or another characteristic in the drawing. It should be noted that the space orientation term can cover different orientations of the device besides the orientation of the device illustrated in the drawing. For example, if the device in the drawing is turned over, the device located "under" or "below" the other devices or characteristics is reoriented to be located "above" the other devices or characteristics. Therefore, the space orientation term "under" may include two orientations of "above" and "below".

Figure 1B:
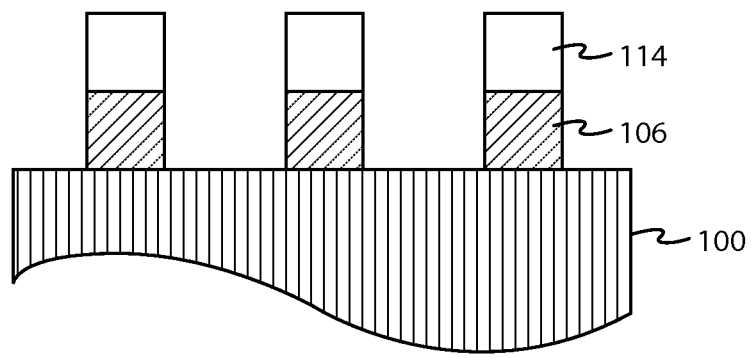
Figure 1C:
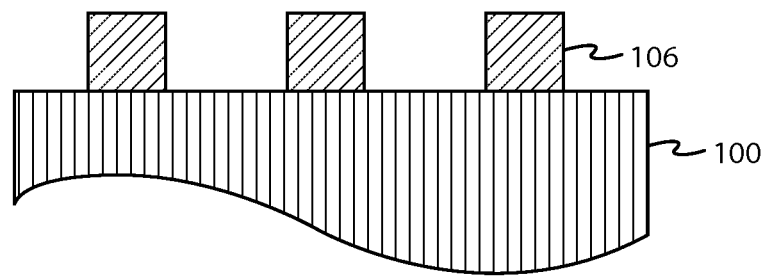
Figure 1D:
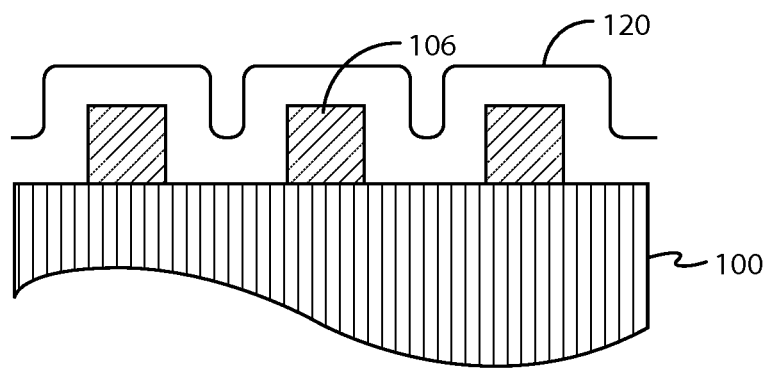
Figure 1E:
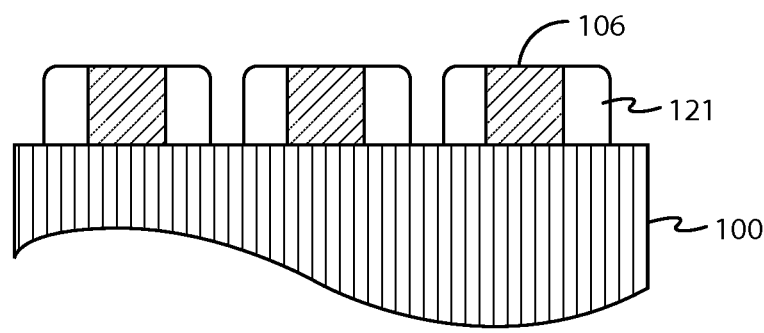
Figure 1F:
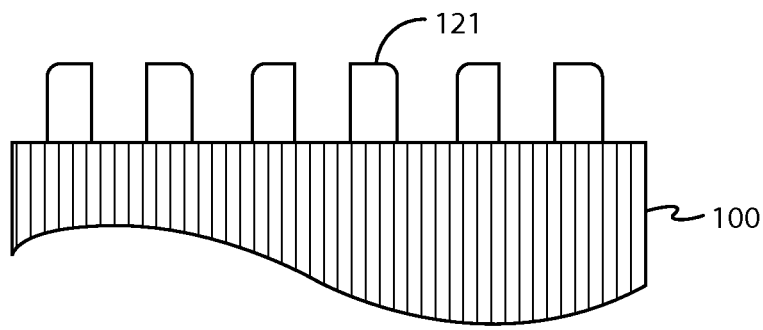
Figure 1G:
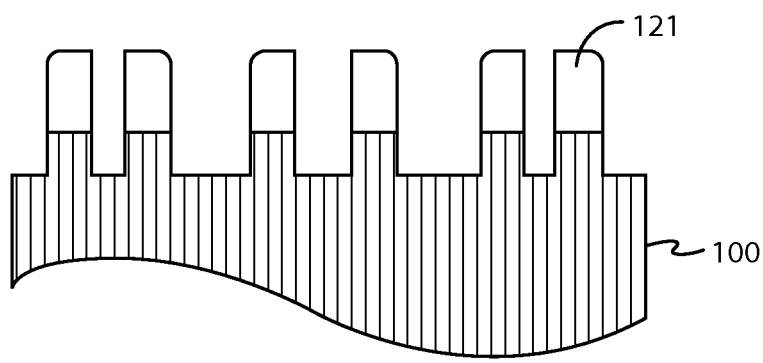
Figure 1H:
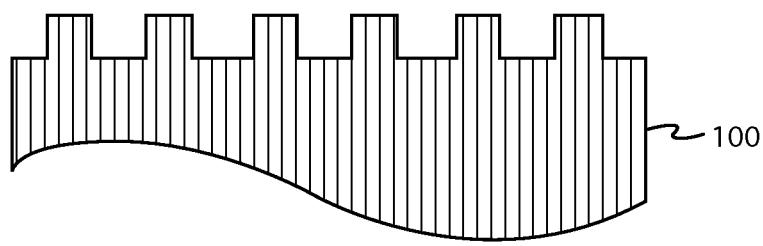

FIGS. 1A-1H are graphical depictions of an exemplary self-aligned double patterning (SADP) method. With reference to FIG. 1A, photolithography can be used to produce a pattern of lines 114 in a photoresist layer on a sacrificial structural layer 105 formed on a substrate 100. The pattern can then be transferred into the sacrificial structural layer 105 using an etching process to form features referred to as placeholders or mandrels 106 as shown in FIG. 1B. The photoresist lines 114 are then stripped as illustrated in FIG. 1C. A conformal layer 120 of material is subsequently deposited over the mandrels 106 as illustrated in FIG. 1D. Spacers 121 can be formed on the sides of the mandrels 106 by etching the conformal material from the horizontal surfaces with an anisotropic spacer etch resulting in the structure illustrated in FIG. 1E. Mandrels 106 can then be removed as illustrated in FIG. 1F leaving behind spacers 121. In this embodiment illustrated in FIG. 1G, the spacers 121 can be used as an etch mask for patterning the substrate and then subsequently removed as shown in FIG. 1H.

One use of the SADP process described in FIGS. 1A to 1H is to form high density arrays of parallel lines. The positive tone SADP process of FIGS. 1A to 1H employs spacers as the etch mask resulting in lines of the same width. While this lends itself readily to forming bit lines, in some embodiments, other features (e.g., pads, power supply lines, string select lines, etc.) are usually used on the same layer to form working devices. A negative tone SADP process can introduce gapfill material between the spacers 121 following the step illustrated in FIG. 1F. This gapfill material can then be planarized and the spacers 121 removed whereby the gapfill material serves as the etch mask. Thus, in a negative tone SADP process the trenches are the same width and the widths of the line can be varied within an IC.

To increase feature density on a substrate, it is often desirable to reduce SADP layout area by merging signal lines with boundary dummy lines of adjacent cells in a layout. At least some processes, however, adopt identical material (mandrel, spacer, etc.) resulting in area penalties and degradation on the resulting IC. As described in more detail below, in order to avoid the area penalties and to substantially prevent the degradation on the resulting IC, some embodiments of the present disclosure merge boundary dummy lines with signal lines to avoid area penalties due to a respective SADP property. Other embodiments of the present disclosure can post-process cell-abutting boundaries to satisfy SADP properties and keep cell functionalities. Further, some embodiments of the present disclosure can allow multiple patterns close to a cell boundary to enhance design flexibility while satisfying SADP properties.

During design of an IC, standard cells in a library can be any geometric form and are generally rectangular in form with the same height but different widths. A bounding box of a logic cell can be a small rectangle that substantially encloses at least a portion of a respective cell, such as enclosing all of the circuit patterns within the respective cell, and can be defined by the boundaries of the wall. Cell connectors or terminals (e.g., the logical connectors) are placed on the cell abutment box, and physical connectors (e.g., the lines or areas to which wires are connected) overlap the abutment box to ensure connections without leaving spaces between the ends of two wires. In such a fashion, standard cells can be constructed so they are placed next to each other with the cell abutment boxes touching (i.e., "abutting" of two cells).

FIGS. 2A and 2B are illustrations of two SADP cell boundaries. With reference to FIG. 2A, an embodiment of a logic cell 200 is provided having components thereon that are supplied with voltage by a positive power line or bus VDD and negative power line or bus VSS. The terms bus and line are used interchangeably in this disclosure and such use should not limit the scope of the claims appended herewith. The cell 200 includes within the boundary box 202 a first pattern 204 (such as, for example, a mandrel pattern) and a second pattern 206 (with spacers 251 between first pattern 204 and second pattern 206) including individual signals lines or pins, such as a Z-signal line or pin 207 and I-signal line or pin 208, wherein Z-signal line or pin 207 is a first pin or active line. The router (not shown) of the place and route EDA tool lays out a conductive path (including one or more conductive lines and/or conductive vias, not shown) that extends from the pin 207 to another cell or device. Similarly, the router generates a connecting path comprising at least one signal wire (conductive line) and/or via that connects to a second signal line or pin 208. This logic cell 200 includes a boundary wire 209 such as, but not limited to, a dummy wire. Portions of the boundary wire 209 and first pattern 204 can be separated from the power lines VDD, VSS by cuts 201 or spacers.

As illustrated in FIG. 2B, to reduce area in the logic cell 200, the I-signal or pin 208 can be merged with the boundary wire 209 to form a second logic cell 210 without the area penalty observed in the logic cell 200 of FIG. 2A. This merge, however, can induce a cell-abutting problem during subsequent design steps. For example, when abutting two logic cells together (e.g., flipping and then merging a second logic cell 210b with a first logic cell 210a) as illustrated in FIG. 2C, a short 212 can result between the two I-signal lines of the first and second logic cells 210a, 210b. In some embodiments, first logic cell 210a is equivalent to second logic cell 210 and second logic cell 210b is a flipped version of first logic cell 210a. Under some processing conditions, when abutting two logic cells together, signal wires of each respective cell can be next to each other. When next to each other, the two process variations may cause current to flow between the signal wires under certain conditions. For example, in some conditions, the insulation material surrounding at least one of the two signal wires can break down allowing current to flow between the two signal wires. In some other conditions, a foreign material, such as metal, can become trapped between the two signal wires, thereby, causing the two signal wires to be connected via the foreign material. In each situation, current can flow between the two signal wires.

To prevent the short and to satisfy appropriate SADP property requirements, different signal wires are separated by one or more spacers or cuts, such as cuts 201, and a first pattern (e.g., a mandrel 204 has surrounding spacers 251, where the spacers 251 are in turn surrounded by one or more second patterns 252 that will be exchanged or replaced with other patterns, such as the boundary patterns that are described below). The cell boundary between the two logic cells 210a, 210b can be exchanged with another cell boundary. For example, in some embodiments, another cell boundary pattern is designed such that the cell boundary between the two logic cells 210a, 210b is swapped or replaced with the other newly designed cell boundary. FIG. 2D is an illustration of a merged cell embodiment having a cell boundary exchanged according to some embodiments of the present disclosure. With reference to FIG. 2D, a merged logic cell 230 is illustrated having the shorted boundary pattern of FIG. 2C exchanged or replaced with another boundary pattern 232. This exemplary boundary pattern 232 includes two I-signal lines 234 and a central mandrel 236 separating the I-signal lines 234 thereby resolving the short observed in FIG. 2C and satisfying the appropriate SADP property requirements. In some embodiments of the present disclosure, this cell boundary exchange or replacement can occur after the cells are positioned next to one another if it is found that any boundary signal wires have a short. In other embodiments of the present disclosure, this cell boundary exchange or replacement can occur during the cell layout design stage while merging two cells. Such an embodiment can provide a resulting cell having a reduced area, reduced spacing and efficient line or pin coverage. Pin coverage includes the number of tracks (not shown) that are covered by a pin, such as Z-signal line or pin 207 and I-signal line or pin 208. The router of the EDA place and route tool lays out conductive lines and vias along a set of vertical and horizontal tracks which form a grid. Therefore, if a pin is long enough to cover two or more tracks, then the router will have more choices for placing the vias. This allows the router to optimize the layout of the conductive lines and vias. The number of tracks that are covered by a pin is referred to as "pin coverage" and the larger the pin coverage, the greater the number of choices available for locating vias.

Figure 3A:
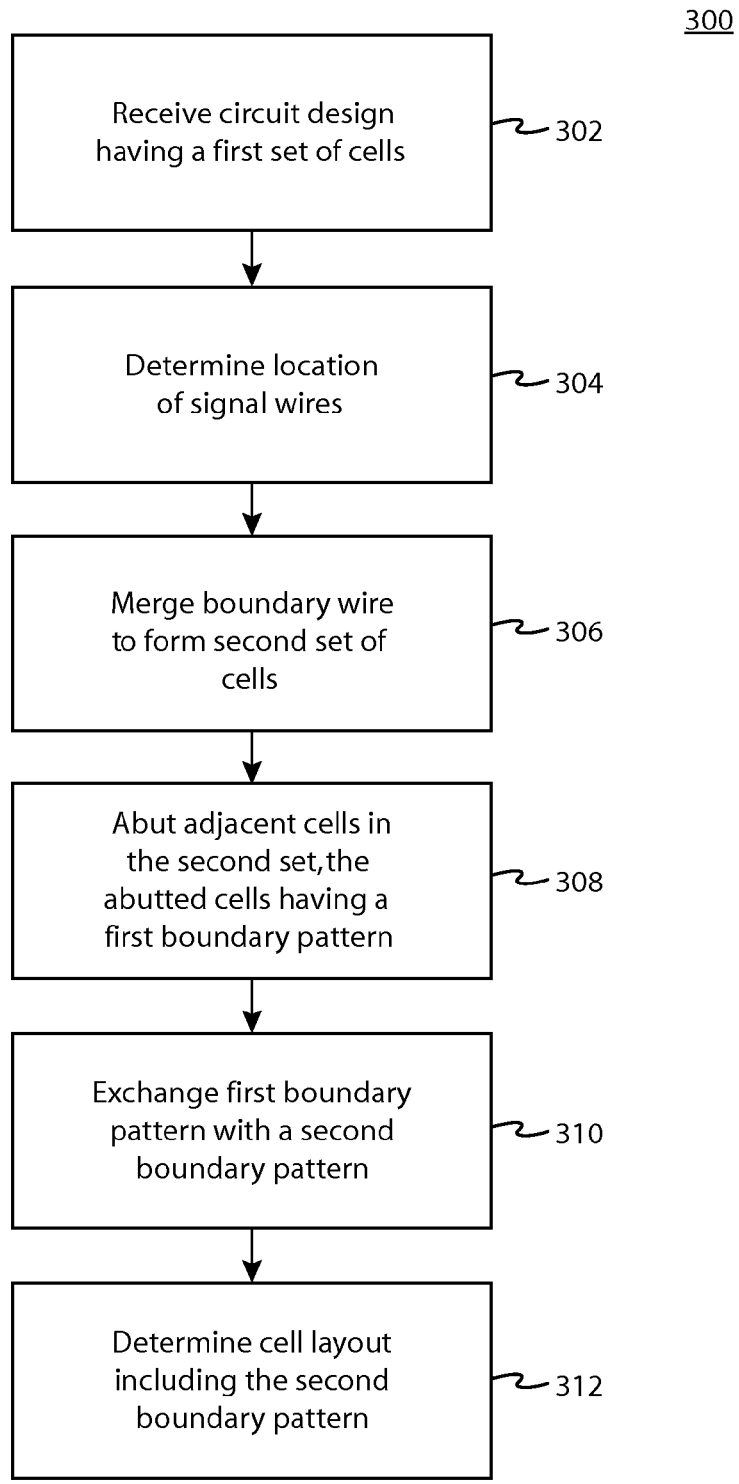
FIGS. 3A and 3B are flow diagrams of various methods for determining a cell layout for use in a patterning process.
Figure 3B:
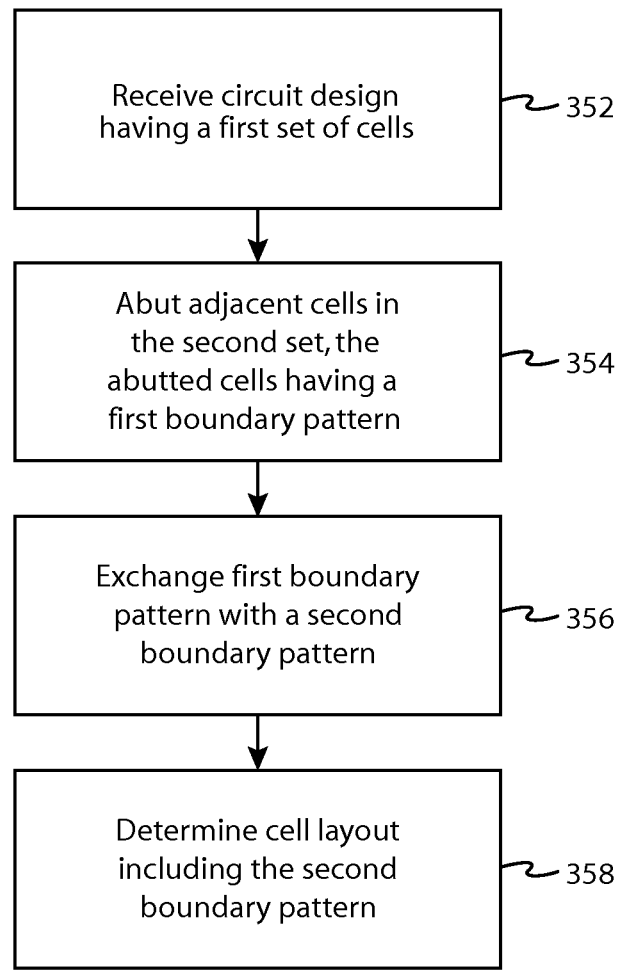

FIGS. 3A and 3B are flow diagrams of various embodiments of the present subject matter. With reference to FIG. 3A, a method 300 is provided for determining a cell layout for use in a patterning process. At step 302, the method includes receiving a predetermined circuit design, the circuit design having a first set of cells, such as logic cell 200 (shown in FIG. 2A). An exemplary circuit design can include two-dimensional patterns corresponding to a circuit design that implements a logic function. In some embodiments, step 302 can include determining core shapes in a mandrel mask and placing shapes in a trim or cut mask. At step 304, locations of signal wires in one or more cells in the first set can be determined. At step 306, a boundary wire, such as boundary wire 209 (shown in FIG. 2A) can be merged with a proximate signal wire in one or more cells in the first set to form a second set of cells, such as logic cell 210 (shown in FIG. 2B). Adjacent cells in the second set can be abutted in step 308 (e.g., flipping a second logic cell, such as logic cell 210b (shown in FIG. 2C), and then merging the flipped second logic cell with a first logic cell, such as logic cell 210a (shown in FIG. 2C). The abutted cells have a first boundary pattern therebetween. As described above, when abutting two cells together, a short, such as short 212 (shown in FIG. 2C) can result. To prevent the short, in some embodiments, the first boundary pattern is exchanged with a second boundary pattern in step 310. For example, the first boundary pattern is swapped or replaced with the second boundary pattern. At step 312, a cell layout is determined for use in a patterning process, the cell layout including the second boundary pattern. In some embodiments, the second boundary pattern can be, but is not limited to a pattern having a dummy wire, two power lines and two signal lines or a pattern having a dummy wire, two power lines and four signal lines. Exemplary patterning processes include, but are not limited to, self-aligned multiple patterning (SAMP), litho-etch-litho-etch (LELE) double patterning, litho-freeze-litho-etch (LFLE) double patterning, and self-aligned double patterning (SADP), to name a few. In some embodiments, step 310 further includes exchanging the first boundary pattern with a second boundary pattern as a function of number or positions of signal wires in the first boundary pattern. Step 310 can occur in some embodiments during the step of abutting adjacent cells or can occur after placement of the cell layout.

With reference to FIG. 3B, another method 350 is provided for determining a cell layout for use in a patterning process. At step 352, the method includes receiving a predetermined circuit design, wherein the circuit design has a first set of cells, such as logic cell 200 (shown in FIG. 2A). An exemplary circuit design can include two-dimensional patterns corresponding to a circuit design that implements a logic function. Method 350 does not include step 304 (shown in FIG. 3A) and step 306 (shown in FIG. 3A), as those steps may have already occurred prior to receiving the predetermined circuit design in step 350. For example, the location of the signal wires could have been determined for the circuit design and the boundary wires could have already been formed prior the circuit design being received for further processing and/or analysis. In some embodiments, step 352 can include determining core shapes in a mandrel mask and placing shapes in a trim or cut mask. At step 354 adjacent cells in the set can be abutted (e.g., flipping a second logic cell, such as logic cell 210b (shown in FIG. 2C), and then merging the flipped second logic cell with a first logic cell, such as logic cell 210a (shown in FIG. 2C), the abutted cells having a first boundary pattern therebetween. In some embodiments, step 354 can include determining locations of signal wires in one or more cells in the first set, merging a boundary wire with a proximate signal wire in one or more cells in the first set to form a second set of cells, and abutting adjacent cells in the second set, the abutted cells having a first boundary pattern therebetween. The first boundary pattern is then exchanged with a second boundary pattern as a function of number or positions of signal wires in the first boundary pattern in step 356. For example, the first boundary pattern is swapped or replaced with the second boundary pattern. At step 358 a cell layout is determined for use in a patterning process, the cell layout including the second boundary pattern. In some embodiments, the second boundary pattern can be, but is not limited to a pattern having a dummy wire, two power lines and two signal lines or a pattern having a dummy wire, two power lines and four signal lines. Exemplary patterning processes include, but are not limited to, self-aligned multiple patterning (SAMP), litho-etch-litho-etch (LELE) double patterning, litho-freeze-litho-etch (LFLE) double patterning, and self-aligned double patterning (SADP), to name a few. Step 356 can occur in some embodiments during the step of abutting adjacent cells or can occur after placement of the cell layout.

Figures 4A, 4B:
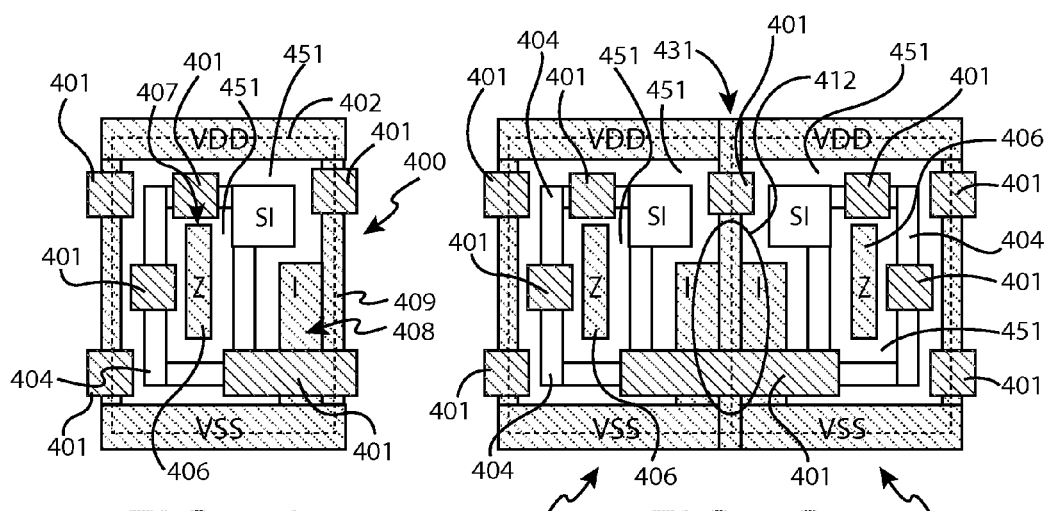
FIGS. 4A-4C are illustrations of another cell boundary exchange according to some embodiments of the present disclosure.
Figure 4C:
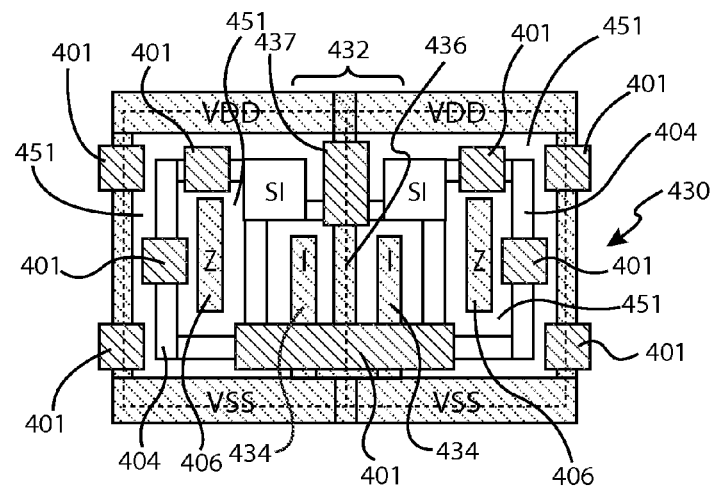

FIGS. 4A-4C are illustrations of another cell boundary exchange according to some embodiments of the present disclosure. With reference to FIG. 4A, an embodiment of a logic cell 400 is provided having components thereon that are supplied with voltage by the VDD and VSS buses. The cell 400 includes within the boundary box 402 a first pattern 404 or mandrel and a second pattern 406 (with spacers 451 between first pattern 404 and second pattern 406) including a central Z-signal line or pin 407 and I-signal line or pin 408 on the bottom portion of the boundary box 402 of the cell 400. The router (not shown) of the place and route EDA tool lays out a conductive path (not shown) that extends from the pin 407 to another cell or device. Similarly, the router generates a connecting path comprising at least one signal wire (conductive line) and/or via that connects to a second signal line or pin 408. The logic cell 400 includes a boundary wire 409 such as, but not limited to, a dummy wire. Portions of the boundary wire 409 and first and second patterns 404, 406 can be separated from the power lines VDD, VSS by cuts 401 or spacers.

Logic cell 400 in FIGS. 4A-4C is different from logic cell 200 (shown in FIGS. 2A-2D) in that logic cell 400 also includes a pin on the mandrel patterns, such as "SI". For example, as illustrated in FIGS. 4A-4C, logic cell 400 has a mandrel pattern pin "SI" on a top portion of boundary box 402 and a second pattern pin "I" on bottom portion of boundary box 402 at the same time. Then, when logic cell 400 is abutted with another instantiation of the same cell, the described boundary exchange method can resolve the patterning issue. As illustrated in FIG. 4B, when abutting two logic cells together (e.g., flipping and then merging a second logic cell 410b with a first logic cell 410a), a short 412 between the two I-signal lines of the first and second logic cells 410a, 410b can result, as described above.

To prevent the short and satisfy appropriate SADP property requirements, the cell boundary between the two logic cells 410a, 410b can be exchanged. For example, another substitute cell boundary pattern is provided such that the cell boundary between the two logic cells 410a, 410b is swapped or replaced with the other substituted cell boundary. In some embodiments, first logic cell 410a is equivalent to logic cell 400 and second logic cell 410b is a flipped version of logic cell 410a. FIG. 4C is an illustration of a merged cell embodiment having a cell boundary exchanged according to some embodiments of the present disclosure. With reference to FIG. 4C, a merged logic cell 430 is illustrated having the shorted boundary pattern 412 of FIG. 4B exchanged with another boundary pattern 432. This exemplary boundary pattern 432 includes two I-signal lines 434 and a central mandrel 436 separating the I-signal lines 434 and connecting the first patterns of the respective sides of the merged logic cell 430 thereby resolving the short observed in FIG. 4B and satisfying the appropriate SADP property requirements. In additional embodiments of the present disclosure, the central mandrel 436 can be provided with a cut 437 or spacer to separate signal lines or wires between the merged logic cell 430. For example, after fabricating the mandrel pattern, the cut 437 divides the mandrel pattern 436 into two patterns. In some embodiments of the present disclosure, this cell boundary exchange can occur after the placement stage if it is found that any boundary signal wires have a short. In other embodiments of the present disclosure, this cell boundary exchange can occur during the cell layout design stage while merging two cells.

Such an embodiment can provide a resulting cell having a reduced area, reduced spacing and efficient pin coverage. As described above, pin coverage indicates the number of tracks (not shown) that are covered by a pin, such as Z-signal line or pin 407 and I-signal line or pin 408 and the SI pin. If a pin covers a large number of tracks, the pin is said to provide efficient pin coverage. If a pin, such as Z-signal line 408, has a length sufficient to cover multiple tracks, then the router will have more choices for placing the vias.

FIGS. 5A-5C are illustrations of a further cell boundary exchange according to other embodiments of the present disclosure. With reference to FIG. 5A, an embodiment of a logic cell 500 is provided having components thereon that are supplied with voltage by power lines VDD, VSS. The cell 500 includes within the boundary box 502 a first pattern 504 or mandrel and a second pattern 506 (with spacers 551 therebetween) including a central Z-signal line or pin 507 and I-signal line or pin 508 on the bottom portion of the boundary box 502 of the cell 500. The router (not shown) of the place and route EDA tool lays out a conductive path (not shown) that extends from the pin 507 to another cell or device. Similarly, the router generates a connecting path comprising at least one signal wire (conductive line) and/or via that connects to the second signal line or pin 508. As illustrated in FIGS. 5A-5C, cell 500 also includes a mandrel pattern pin "SI" on a top portion of the boundary box 502 and a second pattern pin "I" on the bottom portion of the boundary box 502. Logic cell 500 can be abutted with another instantiation of the same cell that also has a top second pattern pin "I" and a bottom mandrel pattern pin "SI". Then, when logic cell 500 is abutted with the other cell, the described boundary exchange method can resolve the patterning issue.

The logic cell 500 includes a boundary wire 509 such as, but not limited to, a dummy wire. Portions of the boundary wire 509 and first and second patterns 504, 506 can be separated from the power lines VDD, VSS by cuts 501 or spacers. As illustrated in FIG. 5B, when abutting two logic cells together (e.g., in this case flipping, inverting and then merging a second logic cell 510b with a first logic cell 510a), a short 512 between the two I-signal lines of the first logic cell 510a and second flipped and inverted logic cell 510b can result, as described above.

To resolve the short and satisfy appropriate SADP property requirements, the cell boundary between the two logic cells 510a, 510b can be exchanged. For example, another substitute cell boundary pattern is designed such that the cell boundary between the two logic cells 510a, 510b is swapped or replaced with the other substitute cell boundary. In some embodiments, first logic cell 510a is equivalent to logic cell 500 and second logic cell 510b is an inverted version of logic cell 510a. FIG. 5C is an illustration of a merged cell embodiment having a cell boundary exchanged according to some embodiments of the present disclosure. With reference to FIG. 5C, a merged logic cell 530 is illustrated having the shorted boundary pattern 512 of FIG. 5B exchanged with another boundary pattern 532. This exemplary boundary pattern 532 includes two I-signal lines 534 and a central, circuitous mandrel 536 separating the I-signal lines 534 and connecting the first patterns of the respective sides of the merged logic cell 530 thereby resolving the short observed in FIG. 5B and satisfying the appropriate SADP property requirements. In additional embodiments of the present disclosure, the central, circuitous mandrel 536 can be provided with a cut 537 or spacer to separate signal lines or wires (not shown) between the merged logic cell 530. For example, after fabricating the mandrel pattern, the cut 537 divides the mandrel pattern 536 into two patterns. In some embodiments of the present disclosure, this cell boundary exchange can occur after the placement stage if it is found that any boundary signal wires have a short. In other embodiments of the present disclosure, this cell boundary exchange can occur during the cell layout design stage while merging two cells. Such an embodiment can provide a resulting cell having a reduced area, reduced spacing and efficient pin coverage.

FIGS. 6A-6C are illustrations of an additional cell boundary exchange according to other embodiments of the present disclosure. With reference to FIG. 6A, an embodiment of a logic cell 600 is provided having components thereon that are supplied with voltage by power lines VDD, VSS. The cell 600 includes within the boundary box 602 a first pattern 604 or mandrel and a second pattern 606 (with spacers 651 therebetween) including a central Z-signal line or pin 607 and I-signal line 608 on the upper boundary of the cell 600. In some embodiments, the router (not shown) of the place and route EDA tool lays out a conductive path (not shown) that extends from the Z-signal line or pin 607 to another cell or device. Similarly, the router generates a connecting path comprising at least one signal wire (conductive line) and/or via that connects to a second signal line, I signal line or pin 608. As illustrated in FIGS. 6A-6C, cell 600 includes a mandrel pattern pin "SI" on a top portion of the boundary box 602 and a second pattern pin "I" on the bottom portion of the boundary box 602, and is abutted with another cell that has a top second pattern pin "I" and a bottom mandrel pattern pin "SI". In some embodiments, the SI pin and the I pin also each facilitate a connection between the router and at least one signal wire.

The logic cell 600 includes a boundary wire 609 such as, but not limited to, a dummy wire. Portions of the boundary wire 609 and first and second patterns 604, 606 can be separated from the power lines VDD, VSS by cuts 601 or spacers. As illustrated in FIG. 6B, when abutting two logic cells together (e.g., in this case flipping, inverting and then merging a second logic cell 610b with a first logic cell 610a), a short 612 between the two I-signal lines of the first logic cell 610a and second flipped and inverted logic cell 610b can result, as described above.

To resolve the short and satisfy appropriate SADP property requirements, the cell boundary between the two logic cells 610a, 610b can be exchanged. More specifically, another cell boundary pattern is designed such that the cell boundary between the two logic cells 610a, 610b is swapped or replaced with the other substitute cell boundary. In some embodiments, first logic cell 610a is equivalent to logic cell 600 and second logic cell 610b is an inverted version of logic cell 610a. FIG. 6C is an illustration of a merged cell embodiment having a cell boundary exchanged according to some embodiments of the present disclosure. With reference to FIG. 6C, a merged logic cell 630 is illustrated having the shorted boundary pattern 612 of FIG. 6B exchanged with another boundary pattern 632. This exemplary boundary pattern 632 includes two I-signal lines 634 and a central, circuitous mandrel 636 separating the I-signal lines 634 and connecting the first patterns of the respective sides of the merged logic cell 630 thereby resolving the short observed in FIG. 6B and satisfying the appropriate SADP property requirements. In additional embodiments of the present disclosure, the central, circuitous mandrel 636 can be provided with a cut 637 or spacer to separate signal lines between the merged logic cell 630. In some embodiments of the present disclosure, this cell boundary exchange can occur after the placement stage if it is found that any boundary signal wires have a short. In other embodiments of the present disclosure, this cell boundary exchange can occur during the cell layout design stage while merging two cells. Such an embodiment can provide a resulting cell having a minimum area, reduced spacing and efficient pin coverage.

Figure 7A:
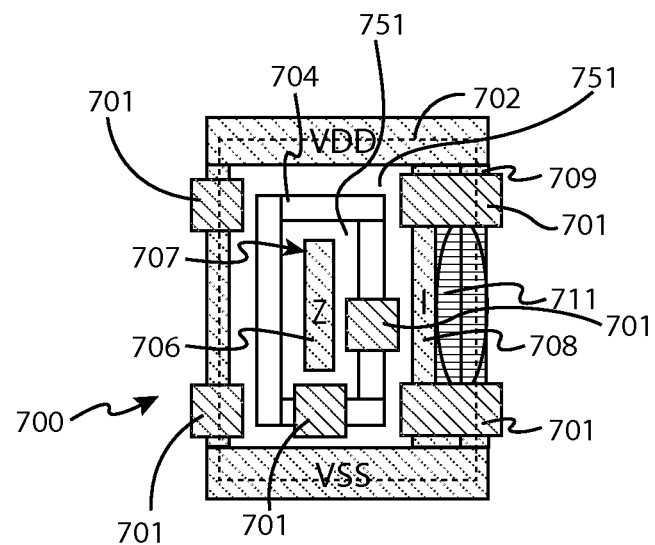
FIGS. 7A and 7B are illustrations of another cell with pin-accessing prevention on cell boundary exchange according to some embodiments of the present disclosure.
Figure 7B:
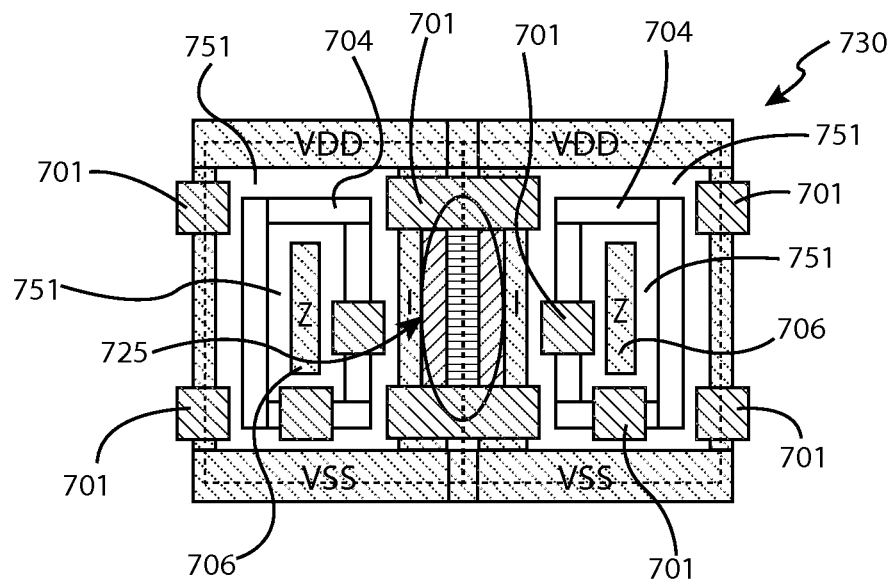

FIGS. 7A and 7B are illustrations of another cell with pin-accessing prevention on cell boundary exchange according to some embodiments of the present disclosure. For example, as described below in more detail, the pins can be blocked such that a router (not shown) is prevented from connecting to various undesired signal wires. With reference to FIG. 7A, another embodiment of a logic cell 700 is provided having components thereon that are supplied with voltage by power lines VDD, VSS. The cell 700 includes within the boundary box 702 a first pattern 704 or mandrel and a second pattern 706 (with spacers 751 therebetween) including a central Z-signal line or pin 707 and I-signal line or pin 708 that is a second pattern pin. In contrast to the other cells described above, cell 700 does not include an "SI" pin. In some embodiments, Z-signal line or pin 707 is a first pin or active line from which the router can lay out a connection (including at least one conductive line and/or via) to at least one signal wire. I-signal line or pin 708 is a second pin or active signal line which the router can connect to at least one external signal wire.

The logic cell 700 includes a boundary wire 709 such as, but not limited to, a dummy wire and a pin signal wire or I-signal line or pin 708 with a pin blockage 711 that is positioned adjacent to I-signal line or pin 708. EDA tools allow a designer to position a "pin blockage" in the layout. The router will not run a connecting line through such a pin blockage. For example, as illustrated in FIG. 7A, pin blockage 711 prevents the router from laying out a conductive line connected to the right side of the I-signal line or pin 708. By inserting the pin blockage 711 on the right side of pin 708, the designer ensures that the right side of the pin 708 is clear, to permit a boundary swap or exchange to be performed.

Portions of the boundary wire 709, first and second patterns 704, 706, and pin signal wire 708 can be separated from the VDD and VSS buses by cuts 701 or spacers. When abutting two logic cells as described above, to keep cell functionality in the chip level in the embodiment illustrated here an abutting boundary wire can be exchanged as described above. Further, a pin blockage 725 can be positioned adjacent to the pins, such as I-signal line or pin 708, to prevent the router from laying out a line on the wrong side of the pin 708 to connect the pin 708 to an external signal wire after an exemplary cell boundary exchange, as described above. Thus as illustrated in FIG. 7B, a merged logic cell 730 is provided without any short and including an appropriate pin blockage 725 for each side of the merged logic cell. In some embodiments of the present disclosure, this cell boundary exchange can occur after the placement stage if it is found that any boundary signal wires have a short. In other embodiments of the present disclosure, this cell boundary exchange can occur during the cell layout design stage while merging two cells.

Figure 8:
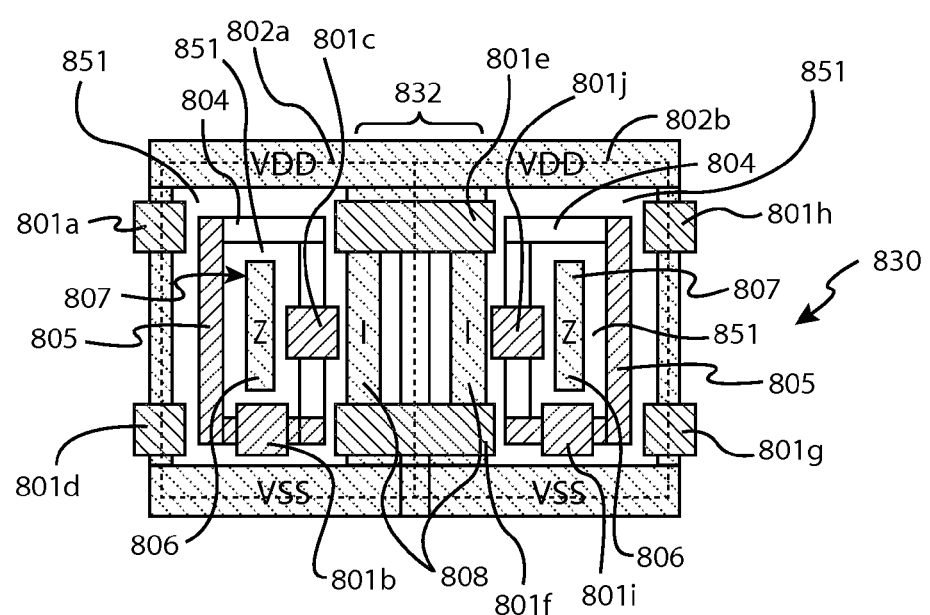
FIG. 8 is an illustration of a merged SAMP cell embodiment having a cell boundary exchanged in accordance with some embodiments of the present disclosure.

While embodiments of the present disclosure have been described with reference to SADP, the claims appended herewith should not be so limited as the concepts herein disclosed are readily applicable to other technologies and methods used to enhance feature density such as, but not limited to, other types of double patterning, self-aligned multiple patterning (SAMP), SADP with trim masks, and the like. For example, FIG. 8 is an illustration of a merged SAMP cell embodiment having a cell boundary exchanged in accordance with some embodiments of the present disclosure. With reference to FIG. 8, a merged logic cell 830 has been generated with components thereon that are supplied with voltage by power lines VDD, VSS. The merged cell 830 includes within each respective boundary box 802a, 802b a first pattern 804 or mandrel, a second pattern or mandrel 805, and a third pattern 806 (with spacers 851 between first pattern 804 and third pattern 806) including a Z-signal line or pin 807 that is centrally located within boundary box 802a and a I-signal line or pin 808 that is also centrally located. This layout is in contrast to the cells described above, wherein each of the pins are located at different positions within the respective boundary box. In some embodiments, Z-signal line or pin 807 is a first pin or active line that can be connected by conductive lines and/or vias (not shown) to at least one signal wire. I-signal line or pin 808 is a second pin or active signal line that can be connected by at least one conductive line and/or via to at least one signal wire.

The merged cell 830 can also include any number of cuts 801a, 801b, 801c, 801d, 801e, 801f, 801g, 801h, 801i, and 801j (e.g., a first cut, second cut and so forth). The merged logic cell 830 includes a boundary wire 809 such as, but not limited to, a dummy wire. While portions of the boundary wire 809 and third pattern 806 are illustrated as being separated from the power lines VDD, VSS by cuts 801a and 801b or spacers, since the concepts herein described are applicable to any number of cell design or geometry, any of the multiple patterns in a logic cell can be separated by such cuts. The boundary pattern 832 to prevent shorting and satisfy SAMP property requirements includes two I-signal lines 808 and a central mandrel 836 separating the I-signal lines 808. In some embodiments of the present disclosure, this cell boundary exchange would occur after the placement stage if it is found that any boundary signal wires have a short. In other embodiments of the present disclosure, this cell boundary exchange would occur during the cell layout design stage while merging two cells. Such an embodiment can provide a resulting cell having a reduced area, reduced spacing and efficient pin coverage, as described above.

It should be noted that while several different SADP embodiments have been illustrated and described herein, such a description should not limit the scope of the claims appended herewith as the present disclosure is applicable to other cell geometries and other schemes to increase pattern density on a substrate including, but not limited to, SAMP, litho-etch-litho-etch (LELE) double patterning, litho-freeze-litho-etch (LFLE) double patterning, and the like.

Figure 9:
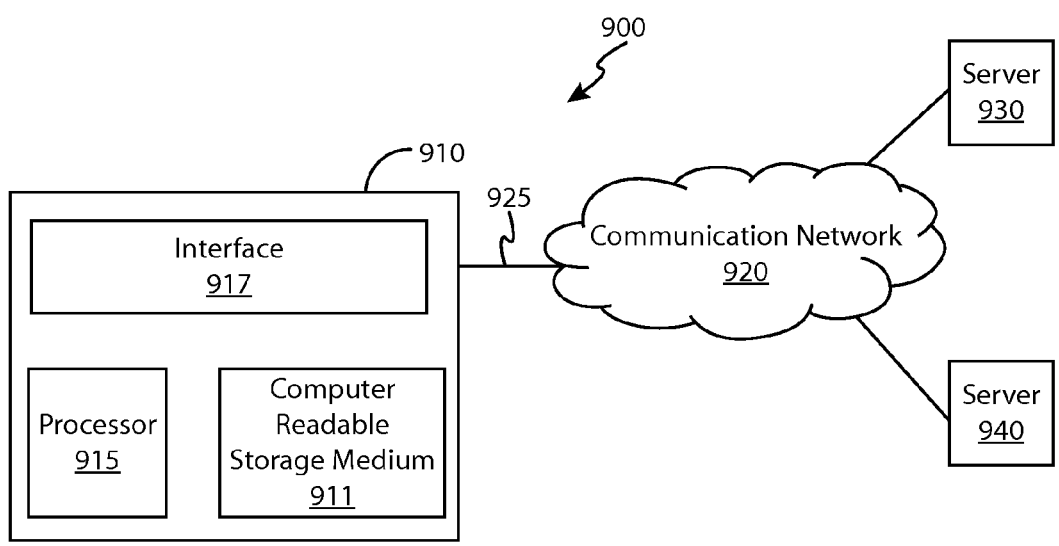
FIG. 9 is a schematic drawing illustrating an exemplary network system for designing, processing and/or modeling integrated circuits.

FIG. 9 is a schematic drawing illustrating an exemplary network system for designing, processing and/or modeling ICs. With reference to FIG. 9, an exemplary network system 900 can include a computer system 910 coupled with servers 930 and 940 through a communication network 920. In some embodiments, the computer system 910 can include a computer readable storage medium 911 encoded with computer program code. The computer system 910 can include a processor 915 electrically coupled with the computer readable storage medium 911. The processor 915 can be configured to execute the computer program code for designing, processing and/or modeling ICs. The processor 915 can be a central processing unit (CPU), a multi-processor, a distributed processing system, and/or any suitable processing unit. In some embodiments, the processor 915 can be configured to receive a circuit design corresponding to a predetermined circuit design, the circuit design having a first set of cells, abut adjacent cells in the first set of cells, the abutted cells having a first boundary pattern therebetween, exchange the first boundary pattern with a second boundary pattern as a function of number or positions of signal wires in the first boundary pattern, and determine a cell layout for use in a patterning process, the cell layout including the second boundary pattern. In other embodiments, the process 915 can be configured to determine locations of signal wires in one or more cells in the first set, merge a boundary wire with a proximate signal wire in one or more cells in the first set to form a second set of cells, and abut adjacent cells in the second set, the abutted cells having a first boundary pattern therebetween. In some embodiments, the second boundary pattern can be, but is not limited to a pattern having a dummy wire, two power lines and two signal lines or a pattern having a dummy wire, two power lines and four signal lines. Exemplary patterning processes include, but are not limited to, self-aligned multiple patterning (SAMP), litho-etch-litho-etch (LELE) double patterning, litho-freeze-litho-etch (LFLE) double patterning, and self-aligned double patterning (SADP), to name a few. Step 356 can occur in some embodiments during the step of abutting adjacent cells or can occur after placement of the cell layout.

In some embodiments, the computer readable storage medium 911 can be an electronic, magnetic, optical, electromagnetic, infrared, a semiconductor system (or apparatus or device), and/or a propagation medium. For example, the computer readable storage medium 911 can include a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 911 can include a compact disk-read only memory (CD-ROM), a compact disk-read/write (CD-R/W), and/or a digital video disc (DVD). In some embodiments, the computer program code stored in the computer readable storage medium 911 can include at least one software and/or circuit related data such as technology files, netlists, electronic design automation (EDA) tools, simulators, and/or any other software or data that are used for designing ICs. In some embodiments, the software can be stored in the servers 930 and 94( )and accessed through the communication network 920, For example, the computer system 910 can be electrically, coupled with the communications network 920 through a wireless and/or wired link 925. The communication network 920 can be, for example, a complete network, a subnet of a local area network, a company-wide intranet, and/or the Internet. The computer system 910 can be identified on the communication network 920 by an address or a combination of addresses, such as a media access control (MAC) address associated with a network interface 917 and an internet protocol (IP) address. The network interface 917 can be, for example, a modem, a wireless transceiver, and/or one or more network interface cards (NICs). In some embodiments, the computer system 910 includes a computer readable storage medium 911 being encoded with computer program code, and a processor 915 electrically coupled with the computer readable storage medium 911. The processor 915 can be configured to execute the computer program code for configuring a design layout as described above.

In some embodiments, a method of determining a cell layout for use in a patterning process includes receiving a predetermined circuit design, wherein the circuit design includes a first set of cells. A boundary wire is merged with a proximate signal wire in one or more cells in the first set of cells to form a second set of cells. The method also includes abutting adjacent cells in the second set of cells, wherein the abutted cells have a first boundary pattern therebetween. The first boundary pattern is exchanged with a second boundary pattern. The method includes determining a cell layout for use in a patterning process, wherein the cell layout includes the second boundary pattern.

In some embodiments, a method of determining a cell layout for use in a patterning process includes receiving a predetermined circuit design, wherein the circuit design includes a first set of cells. The method also includes abutting adjacent cells in the first set of cells, wherein the abutted cells include a first boundary pattern therebetween. The first boundary pattern is exchanged with a second boundary pattern based on a number or positions of signal wires in the first boundary pattern. The method further includes determining a cell layout for use in a patterning process, wherein the cell layout includes the second boundary pattern.

In some embodiments, at least one non-transitory computer-readable storage medium includes computer-executable instructions embodied thereon, wherein, when executed by at least one processor, the computer-executable instructions cause the processor to design a cell layout, wherein a computer program code being arranged to cause the processor to receive a predetermined circuit design, wherein the circuit design includes a first set of cells and includes patterns corresponding to a logic function and to abut adjacent cells in the first set of cells, wherein the abutted cells includes a first boundary pattern therebetween, The computer program code is also being arranged to cause the processor to exchange the first boundary pattern with a second boundary pattern based on a number of signal wires in the first boundary pattern or positions of signal wires in the first boundary pattern and to determine a cell layout for use in a patterning process, the cell layout including the second boundary pattern.

It is emphasized that the above-described embodiments are merely possible examples of implementations, merely set forth for a clear understanding of the principles of the disclosure. Many variations and modifications can be made to the above-described embodiments of the disclosure without departing substantially from the spirit and principles of the disclosure. All such modifications and variations are intended to be included herein within the scope of this disclosure and the present disclosure and protected by the following claims.

Further, the foregoing has outlined features of several embodiments so that those skilled in the art can better understand the detailed description that follows. Those skilled in the art should appreciate that they can readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they can make various changes, substitutions and alterations herein without departing from the spirit and scope of the present disclosure.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing can be advantageous.

As shown by the various configurations and embodiments illustrated in FIGS. 1-9, various cell boundaries for self-aligned multiple patterning abutments have been described.

While preferred embodiments of the present disclosure have been described, it is to be understood that the embodiments described are illustrative only and that the scope of the invention is to be defined solely by the appended claims when accorded a full range of equivalence, many variations and modifications naturally occurring to those of skill in the art from a perusal hereof.

We claim:

1. A double patterning method comprising:
   receiving a circuit design, the circuit design having a first set of cells, one or more of the cells in the first set of cells having a boundary wire at a boundary thereof and a first signal pattern proximate the boundary wire;
   replacing one or more of the cells in the first set of cells with a second set of cells, each of the cells in the second set of cells having a second signal pattern at a boundary thereof;
   placing a first cell from the second set of cells and a second cell from the second set of cells in a first layout so that the second signal pattern at the boundary of the first cell from the second set of cells abuts the second signal pattern at the boundary of the second cell from the second set of cells;
   replacing the second signal patterns at the respective boundaries of the first cell from the second set of cells and the second cell from the second set of cells with a boundary pattern assigned to a first mask and a pair of third signal patterns assigned to a second mask, the boundary pattern located between the pair of third signal patterns and separated from each of the pair of third signal patterns, wherein the step of replacing the second signal patterns defines a second layout different from the first layout, and
   wherein the first mask and the second mask are used in a double patterning process to pattern a single layer of an integrated circuit according to the second layout.

2. The method of claim 1 wherein the patterning process is selected from the group consisting of self-aligned multiple patterning (SAMP), litho-etch-litho-etch (LELE) double patterning, litho-freeze-litho-etch (LFLE) double patterning, self-aligned double patterning (SADP).

3. The method of claim 1 wherein the circuit design includes patterns corresponding to a circuit design that implements a logic function.

4. The method of claim 1, wherein the step of replacing the second signal patterns at the boundaries of the first and the second cells occurs after placing the cell layout.

5. The method of claim 1 wherein the step of replacing the second signal patterns at the boundaries of the first and the second cells occurs during abutting adjacent cells.

6. The method of claim 1 wherein receiving a circuit design further comprises determining core shapes in a mandrel mask and placing shapes in a trim or cut mask.

7. The method of claim 1 wherein the boundary pattern is selected from the group consisting of a pattern having a dummy wire, two power lines and two signal lines or a pattern having a dummy wire, two power lines and four signal lines.

8. The method of claim 7 wherein a pin blockage is positioned proximate to at least one of the second signal lines.

9. A method of determining a cell layout for use in a double patterning process, the method comprising:
   receiving a circuit design, the circuit design having a first set of cells, one or more of the cells in the first set of cells having a cut proximate a boundary wire;
   replacing the one or more of the cells in the first set of cells with a second set of cells, each of the second set of cells having a pair of cuts at a boundary thereof with a pattern between the cuts;
   placing a first cell from the second set of cells, and a second cell from the second set of cells in a first layout so that the pair of cuts at the boundary of the first cell abuts respective ones of the pair of cuts at the boundary of the second cell;
   replacing the respective pattern between the cuts at the boundaries of the first cell from the second set of cells and the second cell from the second set of cells with a boundary pattern assigned to a first mask and a pair of signal patterns assigned to a second mask, the boundary pattern located between the pair of signal patterns and separated from each of the pair of signal patterns, wherein the step of replacing the pattern between the cuts defines a second layout different from the first layout,
   wherein the first mask and the second mask are used in a double patterning process to pattern a single layer of an integrated circuit according to the second layout, the single layer located above a substrate, and a cut mask is used to form the cuts in the single layer after the double patterning process.

10. The method of claim 9 wherein the signal wires are separated by one or more spacers or cuts.

11. The method of claim 9 where the patterning process is selected from the group consisting of self-aligned multiple patterning (SAMP), litho-etch-litho-etch (LELE) double patterning, litho-freeze-litho-etch (LFLE) double patterning, self-aligned double patterning (SADP).

12. The method of claim 9 wherein the circuit design includes patterns corresponding to a logic function.

13. The method of claim 9, wherein replacing the pattern between the cuts occurs after placing the first cell and the second cell.

14. The method of claim 9 wherein receiving the circuit design comprises determining shapes in a mandrel mask and placing shapes in a trim or cut mask.

15. The method of claim 9 wherein the boundary pattern is selected from the group consisting of a pattern having a dummy wire, two power lines and two signal lines or a pattern having a dummy wire, two power lines and four signal lines.

16. At least one non-transitory computer-readable storage medium having computer-executable instructions embodied thereon, wherein, when executed by at least one processor, the computer-executable instructions cause the at least one processor to perform a method comprising:
providing a circuit design including a first cell and a second cell, each of the first cell and the second cell having a first signal pattern at a boundary thereof;
placing the first cell and the second cell in a first layout so that the first signal pattern at the boundary of the first cell abuts the first signal pattern at the boundary of the second cell;
replacing the first signal patterns at the boundaries of the first cell from the second set of cells and the second cell from the second set of cells with a boundary pattern assigned to a first mask and a pair of second signal patterns assigned to a second mask, the boundary pattern located between the pair of second signal patterns and separated from each of the pair of second signal patterns, wherein the step of replacing the first signal patterns defines a second layout
different from the first layout,
wherein the first mask and the second mask are used in a double patterning process to pattern a single layer of an integrated circuit according to the second layout.

17. The at least one non-transitory computer-readable storage medium of claim 16,
wherein the second signal patterns are separated by one or more spacers or cuts.

18. The at least one non-transitory computer-readable storage medium of claim 16, wherein the patterning process is selected from the group consisting of self-aligned multiple patterning (SAMP), litho-etch-litho-etch (LELE) double patterning, litho-freeze-litho-etch (LFLE) double patterning, self-aligned double patterning (SADP).

19. The at least one non-transitory computer-readable storage medium of claim 16, wherein the boundary pattern is selected from the group consisting of a pattern having a dummy wire, two power lines and two signal lines or a pattern having a dummy wire, two power lines and four signal lines, wherein a pin blockage is positioned proximate to at least one of the second signal patterns.

\* \* \* \* \*